(12) United States Patent
Kavalipurapu et al.

(10) Patent No.: US 11,488,677 B2
(45) Date of Patent: Nov. 1, 2022

(54) DISTRIBUTED COMPACTION OF LOGICAL STATES TO REDUCE PROGRAM TIME

(71) Applicant: Micron Technology, Inc., Boise, ID (US)

(72) Inventors: Kalyan Chakravarthy Kavalipurapu, Hyderabad (IN); George Matamis, Eagle, ID (US); Yingda Dong, Los Altos, CA (US); Chang H. Siau, Saratoga, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 12 days.

(21) Appl. No.: 17/247,435

(22) Filed: Dec. 10, 2020

(65) Prior Publication Data
US 2022/0189570 A1    Jun. 16, 2022

(51) Int. Cl.
*G11C 16/10* (2006.01)
*G11C 16/34* (2006.01)
*G11C 16/26* (2006.01)
*G11C 16/30* (2006.01)

(52) U.S. Cl.
CPC .......... *G11C 16/3481* (2013.01); *G11C 16/10* (2013.01); *G11C 16/26* (2013.01); *G11C 16/30* (2013.01); *G11C 16/3404* (2013.01)

(58) Field of Classification Search
CPC ..... G11C 16/3481; G11C 16/10; G11C 16/26; G11C 16/30; G11C 16/3404
See application file for complete search history.

(56) References Cited

U.S. PATENT DOCUMENTS

| | | | |
|---|---|---|---|
| 7,324,383 B2 | 1/2008 | Incamati et al. | |
| 7,499,320 B2 * | 3/2009 | Li | G11C 16/0483 365/185.03 |
| 8,917,553 B2 | 12/2014 | Moschiano et al. | |
| 9,099,183 B2 | 8/2015 | Srinivasan et al. | |
| 2008/0219057 A1 | 9/2008 | Li | |
| 2011/0080789 A1 | 4/2011 | Kalavade et al. | |
| 2021/0406107 A1 * | 12/2021 | Banerjee | G11C 16/26 |

OTHER PUBLICATIONS

International Search Report and Written Opinion for International Application No. PCT/US2021/062698, dated Mar. 11, 2022, 14 pages.

* cited by examiner

*Primary Examiner* — Xiaochun L Chen
(74) *Attorney, Agent, or Firm* — Lowenstein Sandler LLP

(57) ABSTRACT

A memory device includes a memory array of memory cells and control logic, operatively coupled with the memory array. The control logic is to perform operations, which include causing the memory cells to be programmed with an initial voltage distribution representing multiple logical states; causing the memory cells to be programmed with a subsequent voltage distribution representing a subset of the multiple logical states at a higher voltage than that of the initial voltage distribution, wherein the subset of the multiple logical states is compacted above a program verify voltage level for the subsequent voltage distribution; and causing a first program verify operation of the subsequent voltage distribution to be performed on the memory cells to verify one or more voltage levels of the subsequent voltage distribution.

20 Claims, 8 Drawing Sheets

US 11,488,677 B2

DISTRIBUTED COMPACTION OF LOGICAL STATES TO REDUCE PROGRAM TIME

TECHNICAL FIELD

Embodiments of the disclosure relate generally to memory sub-systems, and more specifically, relate to distributed compaction of threshold voltages to reduce program time.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
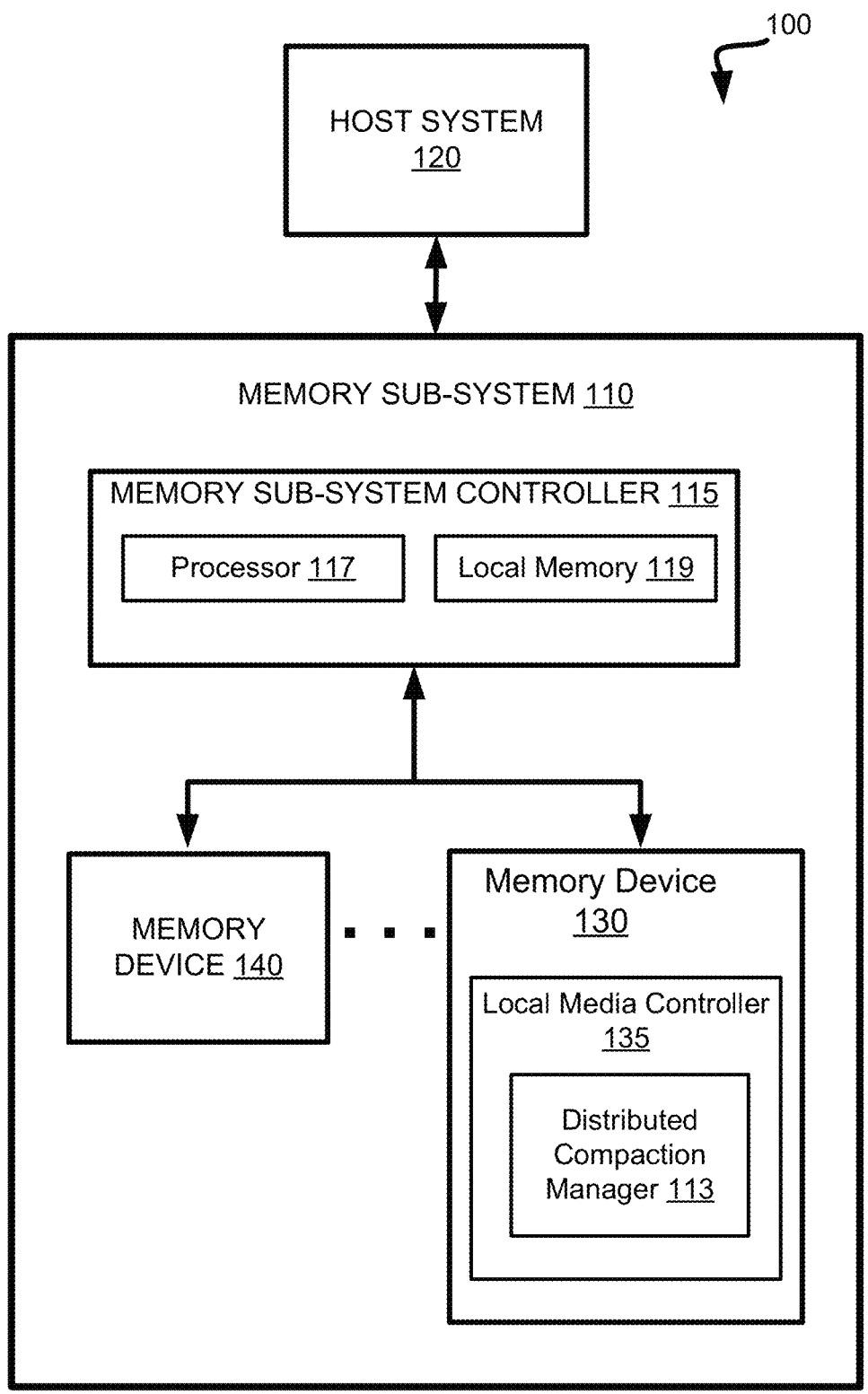
FIG. 1 is an example computing system that includes a memory sub-system in accordance with some embodiments.

Aspects of the present disclosure are directed to distributed compaction of threshold voltages. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below with reference to FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid or a three-dimensional grid. Memory cells are formed onto a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

To program data to an array of memory cells, a local media controller of a NAND device can cause a voltage to be applied across the gates of the memory cells to trap charges (e.g., electrons) in the gates of the memory cells. The memory controller can cause the voltage be applied in a pulse, known as a program pulse, to a wordline associated with memory cells. The amount of voltage and the width of the pulse can determine the amount of charge that will be stored at the memory cells, and in turn programs the state (e.g., a logical state) of the memory cells. In some instances, the local media controller can trigger a program pulse, verify the state of the NAND by triggering a program verify pulse, and then trigger another program pulse if required to bring the cell to the intended voltage level. This pulse-verify-pulse sequence can ensure that the NAND is correctly programmed without applying a larger voltage that can cause more damage to the NAND.

The local media controller can cause a memory array of multi-level cells (MLCs) to be iteratively programed, in which an initial voltage distribution representing multiple logical states (e.g., L0-L7) is programmed with an initial program pulse. "Logical states" herein shall refer to programmed voltages corresponding to two or more logical levels, e.g., by way of programmed bits. Each logical state is associated with multiple bits, which when programmed to a multi-level cell, together provide a multi-bit NAND state (e.g., 01010101, 11010101, 10111111, and so forth for MLCs, or 010, 110, 111, and so forth for TLCs). As with the initial voltage distribution, a subsequent voltage distribution representing a subset of the multiple logical states can be programmed with a subsequent program pulse.

The local media controller can further trigger a further program pulse, at a higher voltage, while inhibiting a lower threshold voltage (e.g., L0) that is already programmed to cause a subsequent, but higher, voltage distribution representing a subset of the multiple logical states (e.g., L2-L7) to be programmed to the memory cells. This iterative approach to programming can be performed in stages. For example, the local media controller can also cause one or more program verify pulses to be applied down the wordline, in order to read out sensed voltage levels. The local media controller can further perform a compare of the programmed voltage levels (e.g., corresponding to the logical states) with one or more buffered threshold voltages to verify one or more voltage levels of the subsequent voltage distribution. Programmed voltages in a memory cell not yet meeting a target voltage value can be further programmed with a stepped up voltage until the programmed voltage is within a threshold percentage of the target voltage value. In this way, the logical states are iteratively programmed, as the logical states increase in voltage, to avoid being over-programmed.

As iterative programming in this way proceeds to higher-voltage distributions, the subsequent voltage distributions of subsets (to include potentially just one) of the multiple logical states tend to widen, which effect can be exacerbated by age of the memory device. One drawback of a wider voltage distribution of one or more logical states is that the wider voltage distribution can extend through multiple program verify (PV) voltage levels, which in turn requires to trigger multiple program verify pulses in order to verify the logical state(s) of the wider voltage distribution. Triggering more than one program verify pulse to perform a multi-stage program verify for the wider voltage distribution, and particularly if performed frequently, can significantly increase the program time (Tprog) of the memory device.

To resolve this and other deficiencies that will be discussed, the present embodiments employ distributed compaction on select ones of the subsequent voltage distributions that include a subset of at least two of the multiple logical states, e.g., corresponding to target voltage levels to present one or more bits. Compaction can be performed, when programming a subsequent voltage distribution, to program a narrower voltage distribution positioned above a program verify voltage level associated with a lowest logical state that is associated with the subsequent voltage distribution, as will be discussed in more detail. Compaction, for example, can be performed via folding, selective slow program convergence (SSPC), or other compression technique that can encode the logical states of the subsequent voltage distribution into a narrower voltage distribution. In various embodiments, this narrower voltage distribution of the subset of the multiple logical states is associated with the program verify voltage level, but does not span into or over a second program verify voltage level.

In one embodiment, the distributed compaction can be performed at a select interval of the multiple logical states, e.g., every two, three, or four of the multiple logical states. In another embodiment, a width of each (or every other) subsequent voltage distribution is measured, e.g., via a program verify operation as was discussed. If the width of the subsequent voltage distribution of the subset of the multiple logical states is greater than a threshold width value, then compaction is performed in programming a next voltage distribution of a further subset of the multiple logical states. In this way, extending beyond the threshold width value in any given voltage distribution is avoided, without a further penalty of the time required to perform the compaction, e.g., when the compaction is not needed due to sufficiently narrow voltage distributions. Additional or hybrid distributed compaction approaches are envisioned and will be discussed in more detail.

Therefore, advantages of the systems and methods implemented in accordance with some embodiments of the present disclosure include, but are not limited to, limiting the width of voltage distributions while programming memory cells of a memory device. The compacted voltage distributions that result from the disclosed distributed compaction can reduce, by at least one, needed program verify operations and the associated longer program time (Tprog). For example, the program verify operation to be performed after a program pulse programs the memory cells can include sending, across a wordline of the memory cells, at least one fewer program verify pulse compared to if the subsequent voltage distribution of the multiple logical states had not been compacted. The fewer program verify pulses also reduces the current used to generate the program verify pulses on the wordline, also saving on power consumption of the memory device. Other advantages will be discussed and still others will be apparent to those skilled in the art having the benefit of this disclosure.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. A memory sub-system controller 115 (referred to, in some cases, as an external controller) can externally manage the memory device 130 (e.g., perform media management operations on the memory device 130). In some embodiments, the memory sub-system 110 (or a memory device 130) is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, the memory device 130 includes a distributed compaction manager 113 that can be used to manage distributed compaction of voltage distributions of logical states during programming operations of the memory device 130. In some embodiments, the local media controller 135 includes at least a portion of the distributed compaction manager 113.

In various embodiments, the controller 115 includes or controls at least a portion of the distributed compaction manager 113. For example, the controller 115 can include a processor 117 (processing device) configured to execute instructions stored in local memory 119 for performing the operations described herein. In some embodiments, the distributed compaction manager 113 is part of the host system 110, an application, or an operating system. The distributed compaction manager 113 can trigger programming of the memory device with distributed compaction to reduce program time based on reducing the number of program verify operations in between program pulses.

Figure 2:
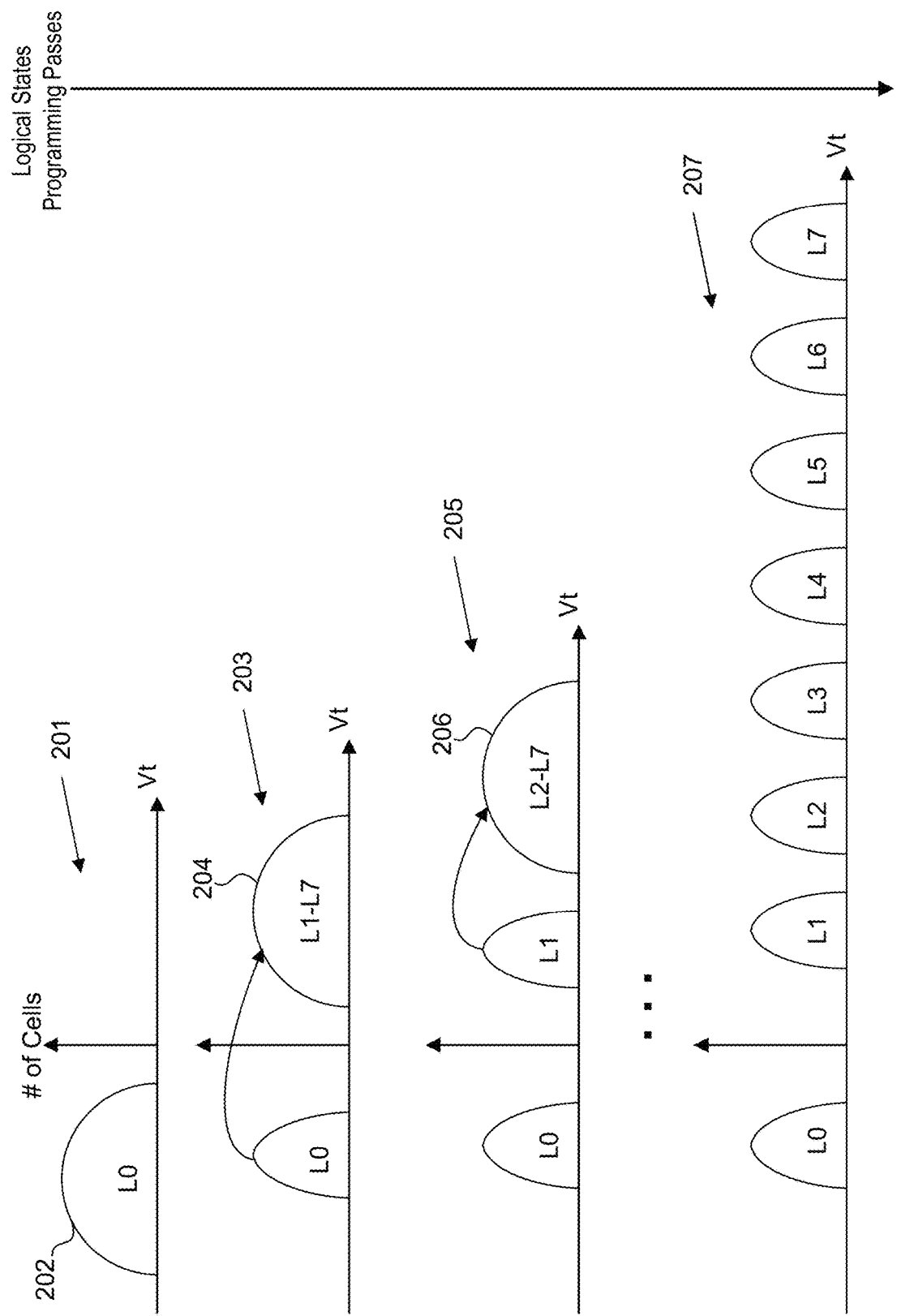
FIG. 2 is a set of graphs that illustrate iterative programming of memory cells, in accordance with one or more embodiments.

FIG. 2 is a set of graphs that illustrate iterative programming of memory cells, in accordance with one or more embodiments. A first graph 201 illustrates an initial voltage distribution 202 of multiple logical states of a group of memory cells. The initial voltage distribution 202 is labeled as L0, which is the lowest logical state, but also includes encoded therein additional logical states, e.g., L2 through L7 of a multi-level cell that can be programmed with eight 3-bit combinations, referenced herein by way of example only. Thus, the initial voltage distribution 202 can be said to represent the multiple logical states L0 through L7. The disclosed principles, features, and methods likewise apply to a TLC, a QLC, and other MLCs.

A second graph 203 illustrates, in a next programming stage, inhibiting the lowest logical state (L0) while further programming a subsequent voltage distribution 204. For example, the subsequent voltage distribution 204 can include a first subset of the multiple logical states (e.g., L1-L7) at a higher voltage than that of the initial voltage distribution 202. While logical states L1-L7 are illustrated for the first subset, the subsequent voltage distribution 204 can include fewer, such as logical states L1-L4. The programming of the subsequent voltage distribution 204 can be viewed as pushing, with a subsequent program pulse, the subset of the multiple logical states from the initial voltage distribution 202 to a higher voltage at the subsequent voltage distribution 204.

A third graph 205 illustrates, in a further programming stage, inhibiting the lowest logical state (L0) and the first logical state (L1) while further programming a second subsequent voltage distribution 206. For example, the second subsequent voltage distribution 206 can include a second subset of the multiple logical states (e.g., L2-L7). The second subset of the multiple logical states has fewer logical states than the first subset of the multiple logical states. The programming of the second subsequent voltage distribution 206 can be viewed as pushing, with a subsequent program pulse, the second subset of the multiple logical states from the subsequent voltage distribution to a higher voltage at the second subsequent voltage distribution 206.

While logical states L2-L7 are illustrated for the second subset, the second subsequent voltage distribution 206 can include fewer, such as logical states L2-L4. Further, in other embodiments, at least the second logical state (L2) is separately programmed before programming the second subsequent voltage distribution 206, which therefore could include L3-L7, or if two logical states (L2 and L3) are first separately programmed, the second subsequent voltage distribution 206 would include logical states L4-L7, for example. In this way, by iteratively programming the multiple logical states at increasingly higher voltages, the multiple logical states (L0-L7) can be finally programmed, as illustrated in graph 207, while avoiding over-programming any of the multiple logical states.

Figure 3A:
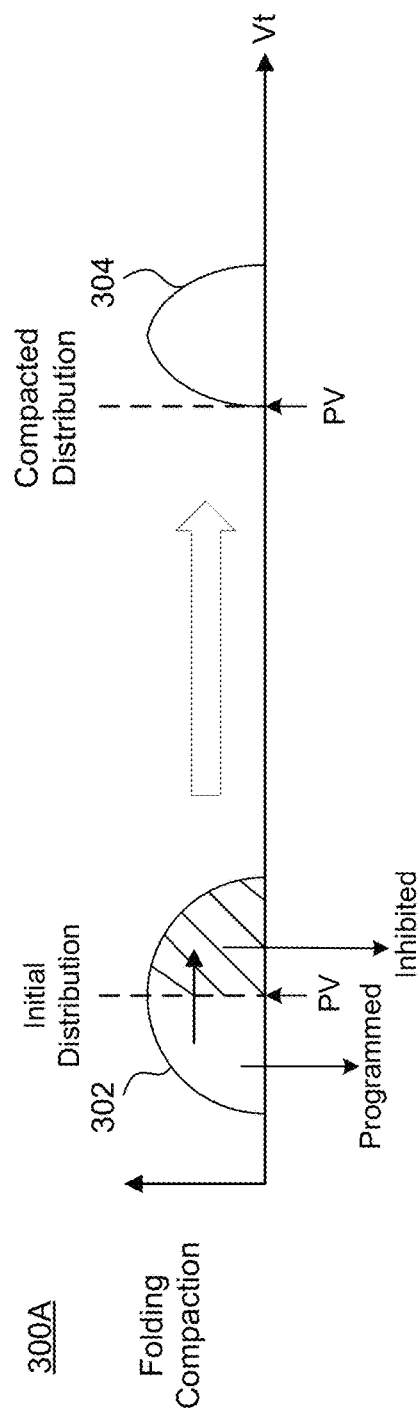
FIG. 3A is an example graph including a representation of folding compaction of logical states within memory cells, in accordance with one or more embodiments.

FIG. 3A is an example graph 300A including a representation of folding compaction of logical states within memory cells, in accordance with one or more embodiments. In one embodiment, the initial voltage distribution 202 disclosed and discussed with reference to FIG. 2 is an initial voltage distribution 302 illustrated in FIG. 3A. Accordingly, the multiple logical states (e.g., L0-L7) are understood to be encoded within the initial voltage distribution 302.

In one embodiment, a program verify (PV) voltage level is identified generally at a middle, or a 50% voltage point, of the initial voltage distribution 302. In other embodiments, the PV voltage level is identified at another percentage level within the initial voltage distribution 302, e.g., at the 40% voltage point, at the 60% voltage point, or at a 90% voltage point (or the like) with respect to the voltage width of the initial voltage distribution 302. Where the PV voltage level is identified can depend on specification requirements in terms of logical states (e.g., voltage values corresponding to bits) being within a threshold value of target voltage values, or depending on where the center of the initial voltage distribution 302 is approximately located along a voltage curve of the initial voltage distribution 302.

To perform folding compaction, the highest-voltage levels of the multiple logical states (which are cross-hatched and above the PV voltage level) are inhibited, as these have surpassed the PV voltage level and thus do not need to be further programmed. The lowest-voltages levels of the multiple logical states (which are below the PV voltage level) are caused to be programmed to the memory cells as a compacted voltage distribution 304 above the program verify (PV) voltage level. Thus, for purposes of explanation, the compacted voltage distribution 304 now includes the lowest 50% of the logical states of the initial voltage distribution 302, enabling a narrower voltage distribution and at least one fewer verify operations than would otherwise be required had compaction not been performed.

Figure 3B:
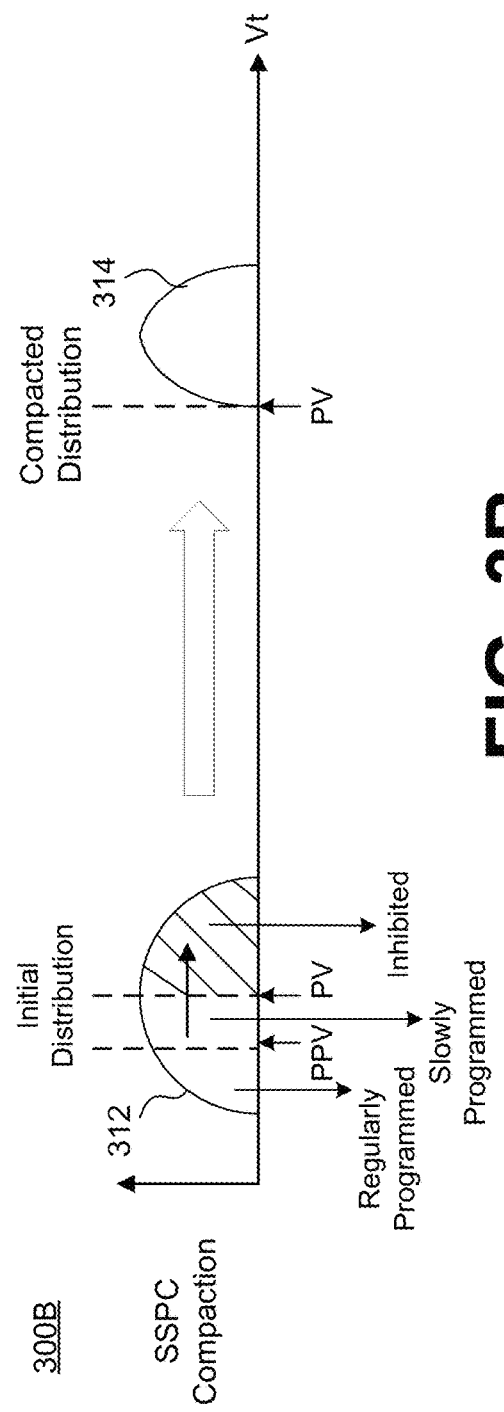
FIG. 3B is an example graph including a representation of the application of selective slow program convergence (SSPC) compaction within the memory cells, in accordance with one or more embodiments.

FIG. 3B is an example graph 300B including a representation of the application of selective slow program convergence (SSPC) compaction within the memory cells, in accordance with one or more embodiments. In the embodiment of FIG. 3B, the program verify (PV) voltage level is similarly identified with reference to an initial voltage distribution 312 as discussed with reference to FIG. 3A. The SSPC compaction, however, is programmed differently from the lowest-voltage levels of the initial voltage distribution 312 as a compacted voltage distribution 314 above the program verify (PV) voltage level. Namely, there are two main stages of programming in which the lowest of the threshold voltage levels (e.g., logical states) are regularly programmed and the higher voltages of the lowest-voltage levels are slowly programmed.

In SSPC programming, multiple pre-verify voltage levels are calculated prior to initiating pre-charging of bitlines of the memory cells. The memory cells are programmed with incrementally increased programming pulses applied to wordlines to which the memory cells are coupled. After each pulse, a program verify operation determines the threshold voltage for each cell. When the threshold voltage reaches a pre-program verify (PPV) threshold, only the bitline connected to that particular cell is biased with a fixed or static intermediate voltage that slows down the change in the voltage level (e.g., logical state) of the cell. The other cells continue to be programmed at their normal pace. As a voltage level corresponding to the logical state for each cell reaches the PPV level, it is biased with the intermediate voltage. All of the bitlines are biased with an inhibit voltage as their threshold voltages reach the verify voltage threshold. In this way, programming the voltage levels (logical states) of the higher-voltage levels is intelligently slowed in order to complete programming to the target voltage levels while taking further precautions against over-programming.

Figure 4A:
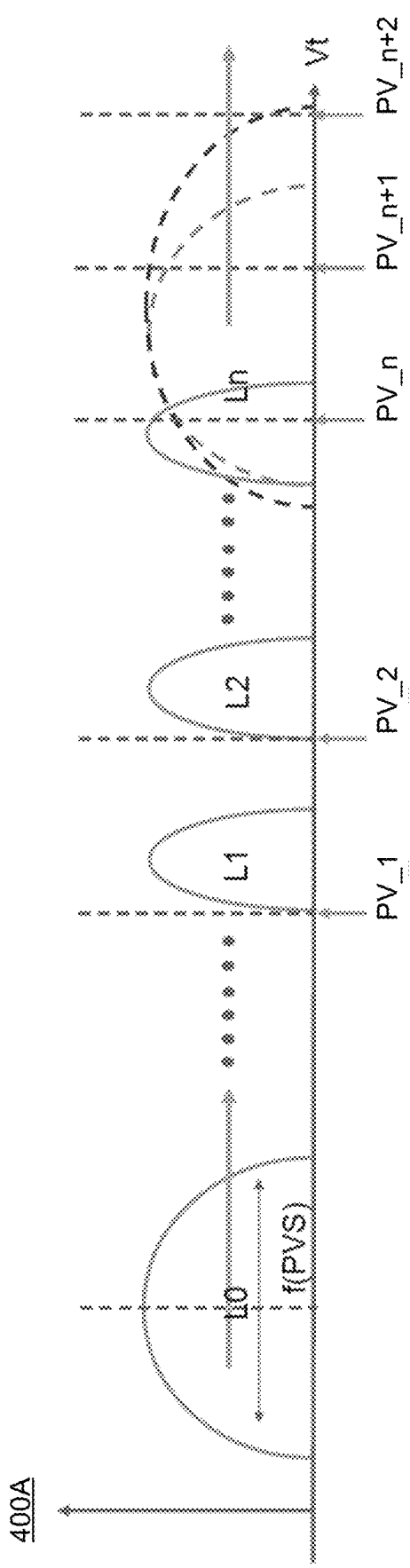
FIG. 4A is an example graph including a representation of iteratively programming logical states, in which an Nth-level voltage distribution overlaps more than one program verify voltage level, in accordance with one or more embodiments.

FIG. 4A is an example graph 400A including a representation of iteratively programming logical states, in which an Nth-level voltage distribution overlaps more than one program verify voltage level, in accordance with one or more embodiments. The graph 400A of FIG. 4A can be viewed as an extension of the set of graphs of FIG. 2, but with multiple program verify (PV) voltage levels (e.g., PV_1, PV_2, . . . PV_n, PV_n+1, and PV_n+2) also identified with reference to each corresponding voltage distribution of logical states, e.g., L1, L2, . . . , Ln, respectively. The width of any given voltage distribution of logical states can be referred to as program Vt sigma (PVS) and, as discussed previously, can tend to increase at higher voltages or higher voltage distributions and with age of the memory device.

More specifically, the voltage distribution at PV_n can, in some situations, extend to cover not only one program verify (PV_n) voltage level, but multiple program verify voltage levels, e.g., PV_n+1 and optionally also PV_n+2 (illustrated in dashed lines). Due to the widen width (PVS) of the nth voltage distribution, a program verify operation requires additional program verify pulses, one for each program verify level, in order to verify multiple voltage levels associated with the logical states spread across the wider voltage distribution.

Figure 4B:
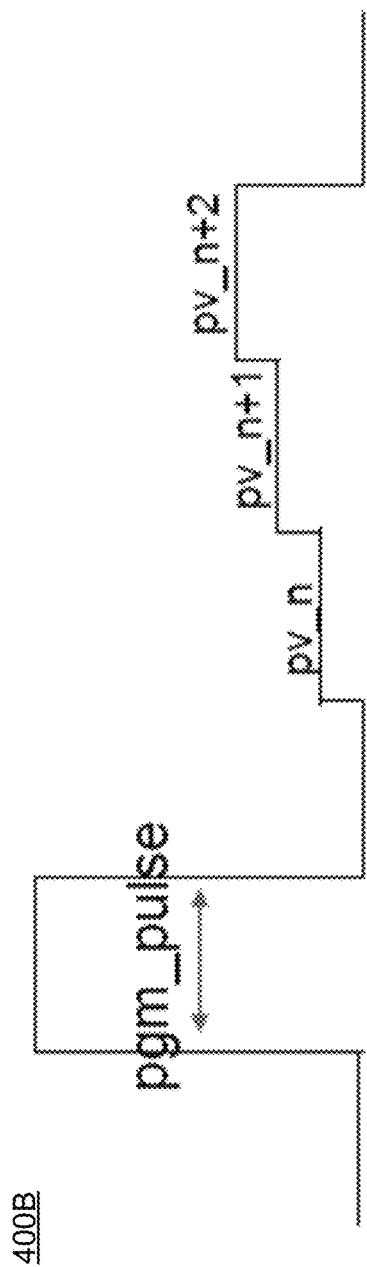
FIG. 4B is an example graph of a program pulse followed by three program verify pulses required to verify the voltage distribution programmed by the program pulse, in accordance with one or more embodiments.

FIG. 4B is an example graph 400B of a program pulse followed by three program verify pulses required to verify the voltage distribution programmed by the program pulse, in accordance with one or more embodiments. The graph 400B of FIG. 4B aides in visually depicting the program pulse that is sent across a wordline to program the nth voltage distribution (Ln). The graph 400B further illustrates the following program verify pulses, pv_n, pv_n+1, and pv_n+2, which are respectively sent to verify the voltage levels associated with, respectively, program verify voltage levels PV_n, PV_n+1, and PV_n+2 that were discussed with reference to graph 400A. These additional program verify pulses, and subsequent verification associated with the program verify operation for the nth logical state, significantly increases the program time (Tprog) for programming the memory cells of the memory device 130, in addition to current required to generate the additional program verify pulses.

Figure 5A:
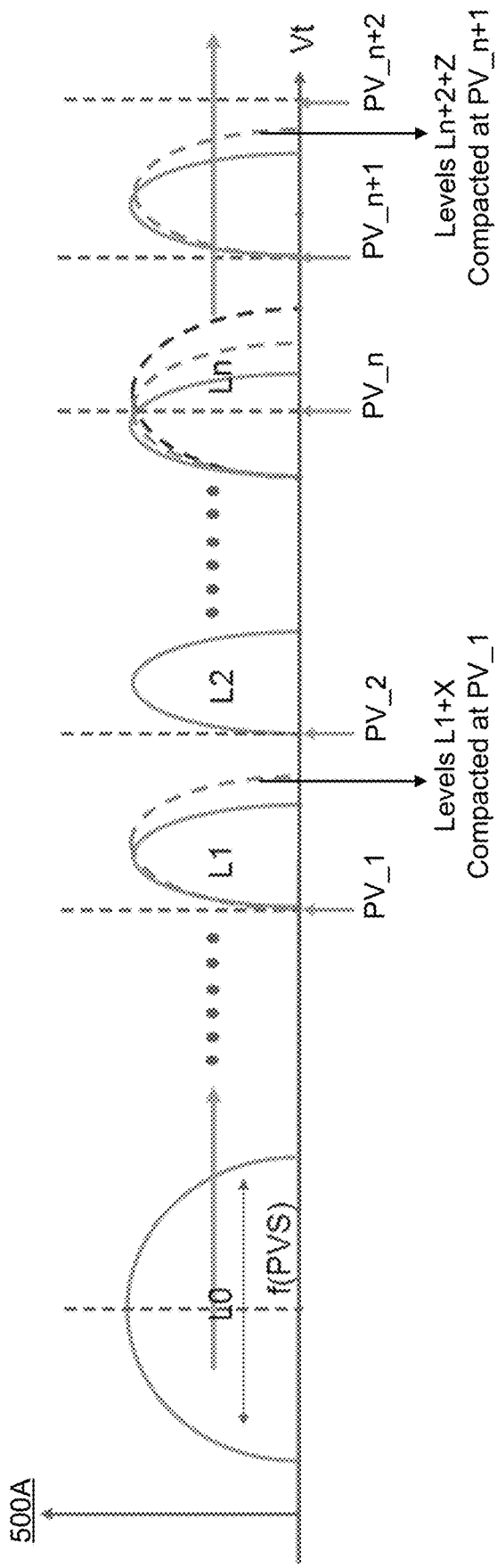
FIG. 5A is an example graph including a representation of iteratively programming logical states, in which compaction of a voltage distribution is selectively performed in conjunction with specific logical states, according to one or more embodiments.

FIG. 5A is an example graph 500A including a representation of iteratively programming logical states (L1, L2, . . . Ln), in which compaction of a voltage distribution is selectively performed in conjunction with specific logical states, according to one or more embodiments. The graph 500A is similar to graph 400A, but now illustrates selective compaction at some of the voltage distributions.

More specifically, the logical states of the first logical state (L1) plus X logical states are compacted out of the initial voltage distribution at the first program verify (PV_1) voltage level. The number X is the number of levels above the first logical state (L1) chosen for compaction, e.g., L2-L4, L2-L5, or the like to be compacted with L1. This makes the compacted voltage distribution of the logical states, e.g., L1-L4 or L1-L5, much tighter than would be otherwise, and more predictable to verify in a program verify operations. In various embodiments, for example, the subset of the multiple logical states to be compacted is a first percentage of all of the multiple logical states programmed in the initial voltage distribution that have a highest voltage range compared to a remaining second percentage. The remaining second percentage has a lower voltage range and can be inhibited.

With additional reference to FIG. 5A, the logical states Ln+2+Z can be compacted with logical state Ln+1 at PV_n+ 1, illustrated towards the right of the graph 500A. The number Z is the number of levels above the n+1th logical state to be compacted with the n+1th logical state. The value of n can be selected depending on how quickly the voltage distributions are widening beyond an acceptable PVS, such that for a small value of n, the second compaction is performed sooner. The compaction thus performed can continue onward and be distributed over the iterative programming into higher-voltage logical states.

In various embodiments, the distributed compaction manager 113 can perform a one check fail byte to check the various voltage reaches for the logical states being compacted, e.g., to determine when to start triggering the compaction for these logical states. As one example, if 50% of the L1+X cells are above the first program verify (PV_1) voltage, the distributed compaction manager 113 can trigger compaction to inhibit L1+X cells above PV_1 and only program the L1+X cells that are below PV_1. This progressive voltage distribution tightening lowers the PVS value and can facilitate greater read-write bandwidth as compared to when no compaction is performed, as well as being able to program a greater number of bits per cell. The read-write bandwidth makes reference to the voltage gaps between the voltage distributions. Further, SSPC compaction can be employed at compaction program verifies instead of folding to achieve a lower PVS value in a compacted voltage distribution.

Figure 5B:
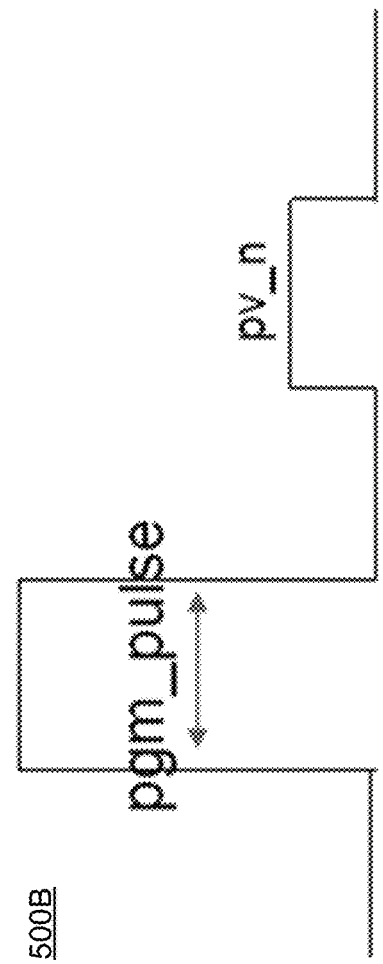
FIG. 5B is an example graph of a program pulse followed by a single program verify pulse required to verify the voltage distribution programmed by the program pulse, in accordance with one or more embodiments.

FIG. 5B is an example graph 500B of a program pulse followed by a single program verify pulse required to verify the voltage distribution programmed by the program pulse, in accordance with one or more embodiments. Because each of the logical states touches or extends over a single program verify ($PV\_n$) voltage level, only a single program verify pulse ($pv\_n$) is required to verify one or more voltage levels of each respective voltage distribution. Accordingly, the distributed compaction of at least some of the subsequent voltage distributions after the initial voltage distribution is programmed reduces the number of program verifies.

The decision of how much compaction, when to perform compaction, and how many levels to include in each compaction can be based on how narrow a voltage distribution is desired balanced with the additional time required to perform compaction. In some embodiments, a user-adjustable setting for at least two or three levels of compaction can be programmed into the firmware of the local media controller 135. One of these two or three known settings can be programmed upon manufacturing of the memory device 130, but could be further programmable later on during use via a firmware update, for example. In some embodiments, some of the information useable to perform the distributed compaction can also be stored in a hardware latch of the local media controller 135.

Figure 6:
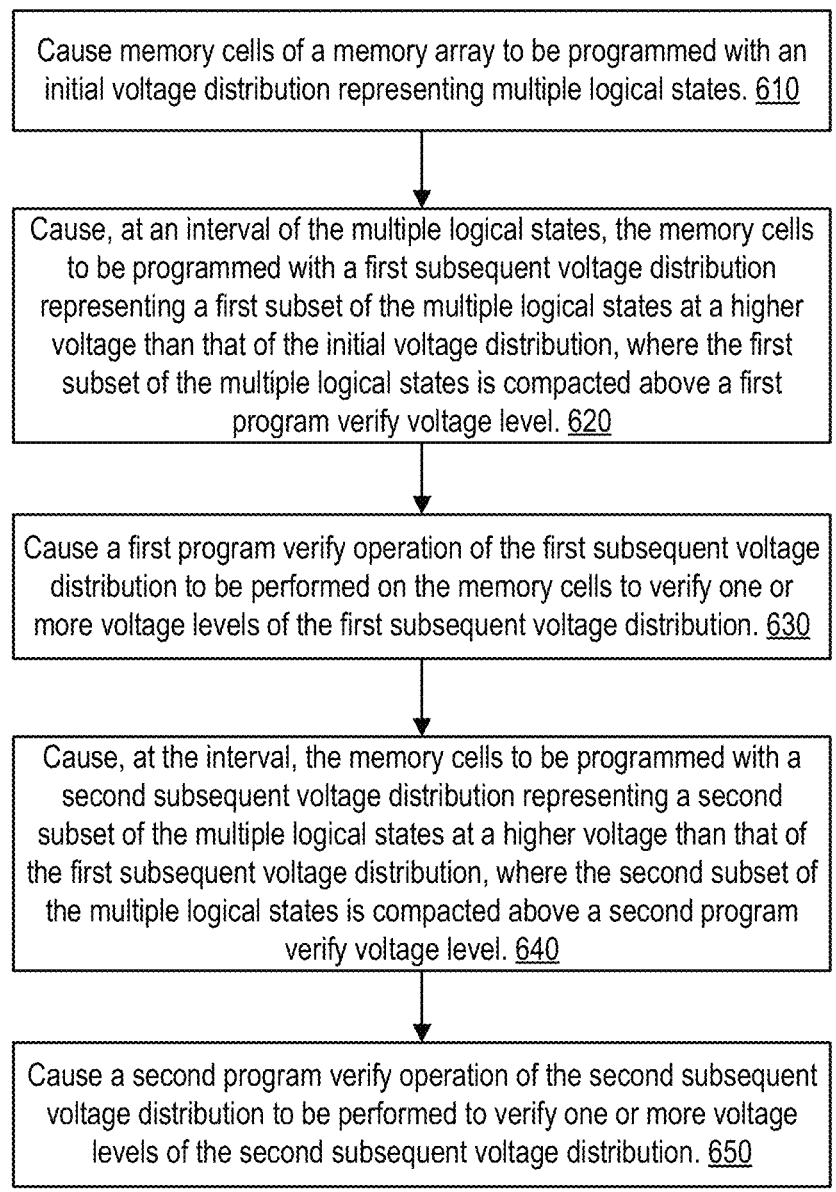
FIG. 6 is a flow diagram of an example method of distributed compaction of threshold voltages at intervals of multiple logical states, in accordance to one or more embodiments.

FIG. 6 is a flow diagram of an example method 600 of distributed compaction of threshold voltages at intervals of multiple logical states, in accordance to one or more embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the distributed compaction manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, memory cells are initially programmed. For example, the processing logic (e.g., distributed compaction manager 113) causes memory cells of a memory array to be programmed with an initial voltage distribution representing multiple logical states. For example, the initial voltage distribution is of all the logical states of the memory cells.

At operation 620, logical states are compacted, e.g., as discussed with reference to FIGS. 3A-3B and 5A-5B. For example, the processing logic causes, at an interval of the multiple logical states, the memory cells to be programmed with a first subsequent voltage distribution representing a first subset of the multiple logical states at a higher voltage than that of the initial voltage distribution. Also, at operation 620, the first subset of the multiple logical states is compacted above a first program verify voltage level when programmed to the memory cells. In one embodiment, the first subsequent voltage distribution is of one of two or three logical states subsequent to a lowest voltage level (e.g., the first level (L0)) of the first subsequent voltage distribution. The interval can be one of every two, three, or four of the multiple logical states, for example.

At operation 630, a program verify operation is performed. For example, the processing logic causes a first program verify operation of the first subsequent voltage distribution to be performed on the memory cells to verify one or more voltage levels of the first subsequent voltage distribution. For example, causing the first program verify operation to be performed includes sending, across a wordline of the memory cells, at least one fewer program verify pulse compared to if the first subsequent voltage distribution had not been compacted.

At operation 640, different logical states are compacted. For example, the processing logic causes, at the interval, the memory cells to be programmed with a second subsequent voltage distribution representing a second subset of the multiple logical states at a higher voltage than that of the first subsequent voltage distribution. Also at operation 640, the second subset of the multiple logical states is compacted above a second program verify voltage level that is greater than the first program verify voltage level when programmed to the memory cells. In one embodiment, the processing logic also causes the memory cells to be programmed with at least one logical state, of the multiple logical states, between programming of the first subsequent voltage distribution and the second subsequent voltage distribution.

At operation 650, a program verify operation is performed. For example, the processing logic causes a second program verify operation of the second subsequent voltage distribution to be performed to verify one or more voltage levels of the second subsequent voltage distribution. For example, causing the second program verify operation to be performed includes sending, across the wordline of the memory cells, at least one fewer program verify pulse compared to if the second subsequent voltage distribution had not been compacted.

Figure 7:
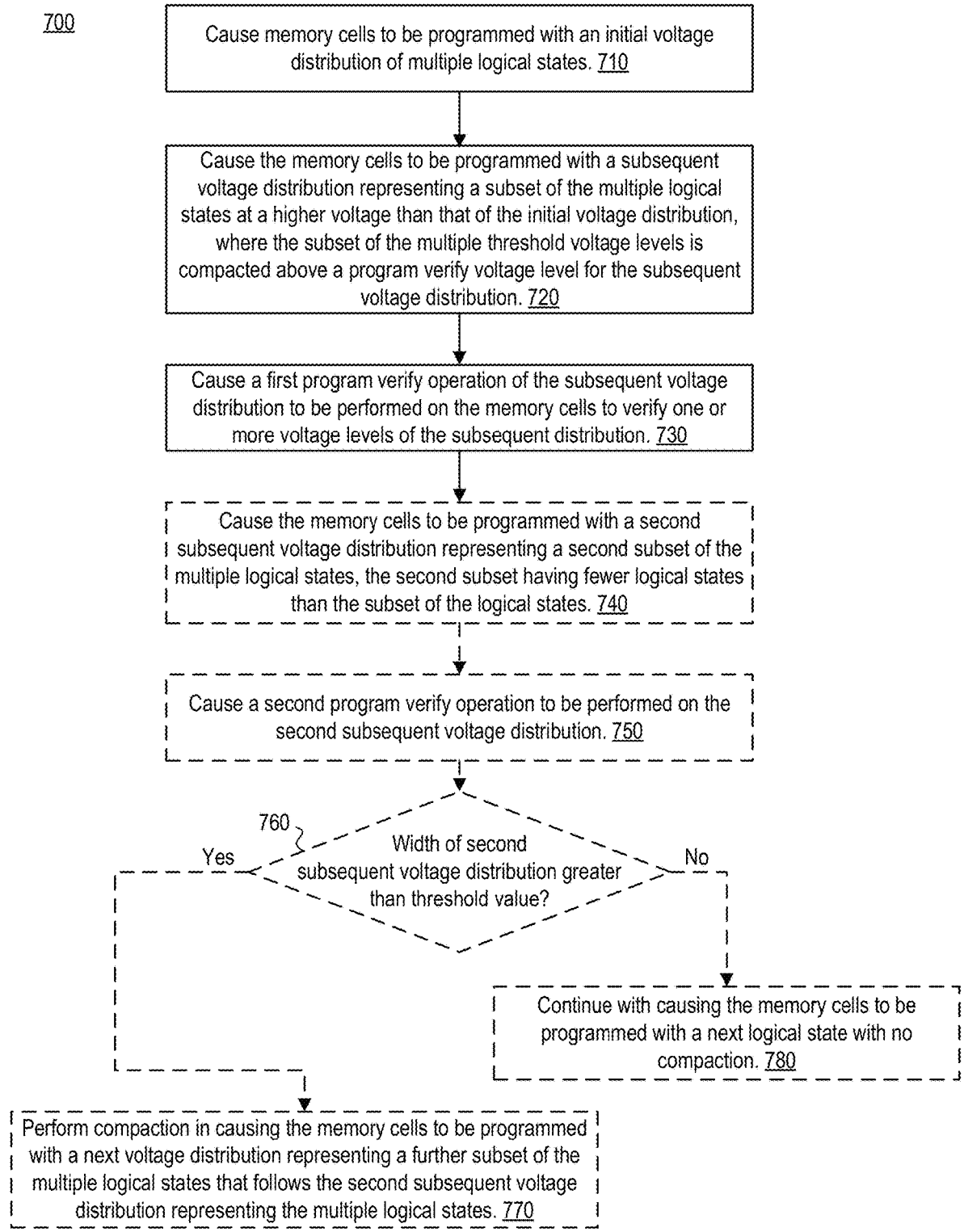
FIG. 7 is a flow diagram of an example method of distributed compaction of threshold voltages based on a width of a subsequent voltage distribution of multiple logical states, in accordance with one or more embodiments.

FIG. 7 is a flow diagram of an example method of distributed compaction of threshold voltages based on a width of a subsequent voltage distribution of multiple logical states, in accordance with one or more embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the distributed compaction manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 710, the memory cells are initially programmed. For example, the processing logic (e.g., the distributed compaction manager 113) causes the memory cells to be programmed with an initial voltage distribution of multiple logical states. For example, the initial voltage distribution is of all the logical states of the memory cells.

At operation 720, logical states are compacted, e.g., as discussed with reference to FIGS. 3A-3B and 5A-5B. For example, the processing logic causes the memory cells to be programmed with a subsequent voltage distribution representing a subset of the multiple logical states at a higher voltage than that of the initial voltage distribution. Also, at operation 720, the subset of the multiple logical states is compacted above a program verify voltage level for the subsequent voltage distribution when programmed to the memory cells. In one embodiment, the subsequent voltage distribution is of all the logical states except for a first level (L0) of the multiple logical states. In another embodiment, the subsequent voltage distribution is of the subset of the multiple logical states that are fewer than all remaining logical states. In various embodiments, the subset of the multiple logical states is between 40 and 60 percent of all of the multiple logical states that have at a highest voltage range compared to a remaining 60 to 40 percent, respectively.

At operation 730, a program verify operation is performed. For example, the processing logic causes a first program verify operation of the subsequent voltage distribution to be performed on the memory cells to verify one or more voltage levels of the subsequent voltage distribution. For example, causing the program verify operation to be performed includes sending, across a wordline of the memory cells, at least one fewer program verify pulse compared to if the subsequent voltage distribution of the multiple logical states had not been compacted. The remainder of the operations are optional, as indicated by the dashed boxes.

At operation 740, the memory cells are further programmed. For example, the processing logic causes the memory cells to be programmed with a second subsequent voltage distribution representing a second subset of the multiple logical states, the second subset having fewer logical states than the subset of the multiple logical states. In one embodiment, the operations further include programming at least one logical state, of the multiple logical states, between the subsequent voltage distribution and the second subsequent voltage distribution. At operation 750, the processing logic causes a second program verify operation to be performed on the second subsequent voltage distribution.

At operation 760, a width is determined. For example, the processing logic determines whether a width (e.g., PVS) of the second subsequent voltage distribution is greater than a threshold value. If, at operation 760, the width is greater than the threshold value, then, at operation 770, the processing logic performs compaction in causing the memory cells to be programmed with a next voltage distribution of a further subset of the multiple logical states that follows the second subsequent voltage distribution of the multiple logical states. If, at operation 760, the width is less than or equal to the threshold value, than, at operation 780, the processing logic continues with causing the memory cells to be programmed with a next logical state with no compaction.

Figure 8:
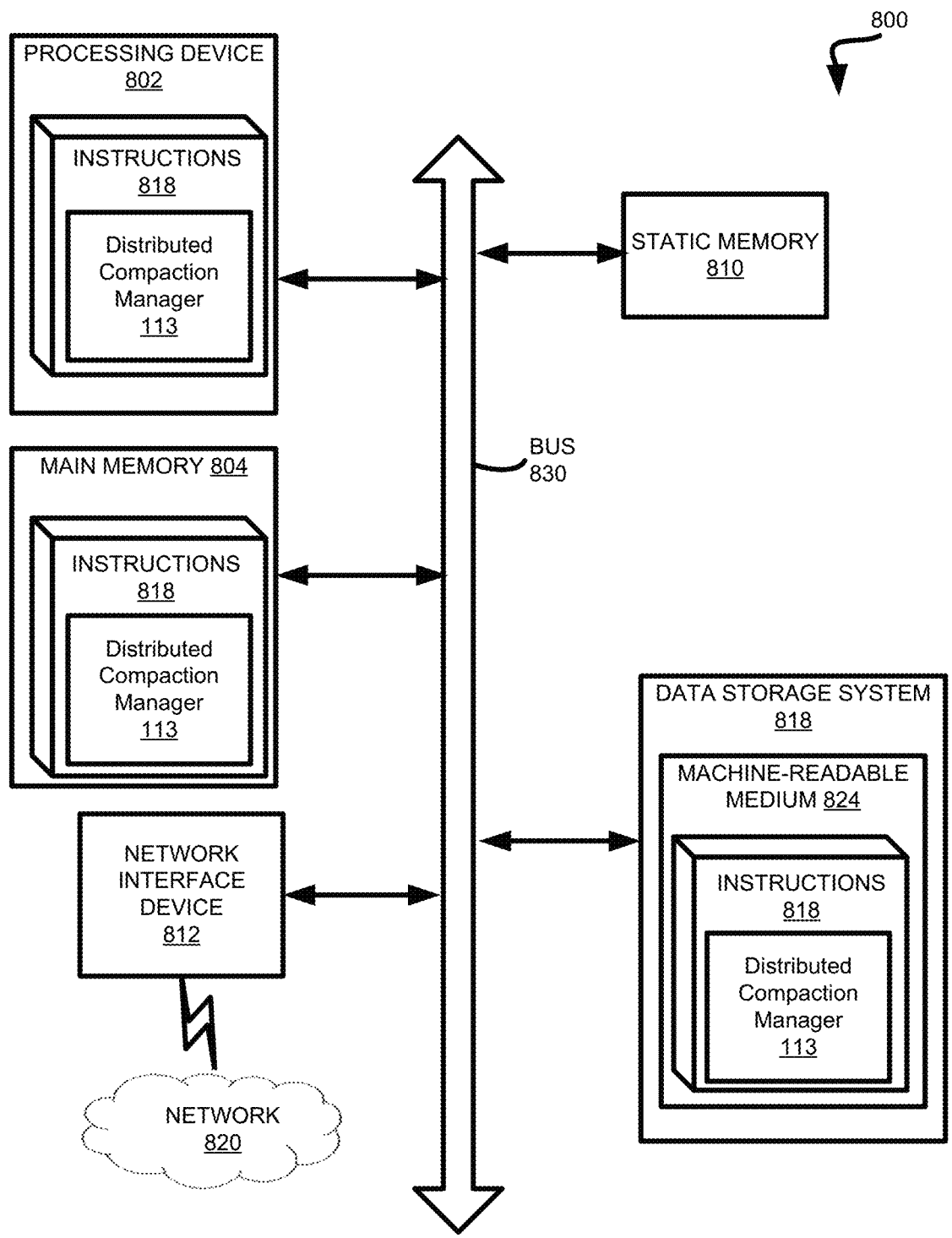
FIG. 8 is a block diagram of an example computer system in which implementations of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the distributed compaction manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to a selective relocation component (e.g., the distributed compaction manager 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium," or equally "non-transitory computer readable medium," shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising memory cells; and
control logic, operatively coupled with the memory array, the control logic to perform operations comprising:
  causing the memory cells to be programmed with an initial voltage distribution representing multiple logical states;
  causing the memory cells to be programmed with a compacted subsequent voltage distribution representing a subset of logical states comprising an encoded compression of at least two of the multiple logical states, the compacted subsequent voltage distribution being programmed above a program verify voltage level at a higher voltage range than that of the initial voltage distribution, wherein the compacted subsequent voltage distribution is to span between the program verify voltage level and a next-higher program verify voltage level of the multiple logical states that is above the program verify voltage level; and
  causing a first program verify operation of the compacted subsequent voltage distribution to be performed on the memory cells at the program verify voltage level to verify one or more voltage levels of the compacted subsequent voltage distribution.

2. The memory device of claim 1, wherein the initial voltage distribution represents all the logical states of the memory cells, and the compacted subsequent voltage distribution represents a remainder of the logical states except for a first level (L0) of the multiple logical states.

3. The memory device of claim 1, wherein the initial voltage distribution represents all the logical states of the memory cells, and the compacted subsequent voltage distribution represents the subset of the multiple logical states that are fewer than all remaining logical states.

4. The memory device of claim 1, wherein the operations further comprise:
causing the memory cells to be programmed with a second subsequent voltage distribution representing a second subset of logical states comprising at least two of the multiple logical states, the second subset of logical states having fewer logical states than the subset of logical states;
causing a second program verify operation to be performed on the second subsequent voltage distribution;
determining a width of the second subsequent voltage distribution; and
performing, based on the width being greater than a threshold value, compaction in causing the memory cells to be programmed with a next voltage distribution representing a further subset of logical states comprising an encoded compression of at least two of the multiple logical states that follows the second subsequent voltage distribution.

5. The memory device of claim 4, wherein the operations further comprise programming at least one logical state, of the multiple logical states, between the compacted subsequent voltage distribution and the second subsequent voltage distribution.

6. The memory device of claim 1, wherein the subset of logical states is a first percentage of all of the multiple logical states that have a highest voltage range compared to a remaining second percentage.

7. The memory device of claim 1, wherein causing the program verify operation to be performed comprises sending, across a wordline of the memory cells, at least one fewer program verify pulse compared to if the compacted subsequent voltage distribution representing the multiple logical states had not been compacted.

8. A method comprising:
causing memory cells of a memory array to be programmed with an initial voltage distribution representing multiple logical states;
causing, at an interval of the multiple logical states, the memory cells to be programmed with a first compacted voltage distribution representing a first subset of logical states comprising an encoded compression of at least two of the multiple logical states, the first compacted voltage distribution being programmed above a first program verify voltage level at a higher voltage range than that of the initial voltage distribution, wherein the first compacted voltage distribution is to span between the first program verify voltage level and a next-higher program verify voltage level of the multiple logical states that is above the first program verify voltage level;
causing a first program verify operation of the first compacted voltage distribution to be performed on the memory cells at the first program verify voltage level to verify one or more voltage levels of the first compacted voltage distribution;
causing, at the interval, the memory cells to be programmed with a second compacted voltage distribution representing a second subset of logical states comprising an encoded compression of at least two of the multiple logical states, the second compacted voltage distribution being programmed above the next-higher program verify voltage level at a higher voltage range than that of the first compacted voltage distribution; and
causing a second program verify operation of the second compacted voltage distribution to be performed at the next-higher program verify voltage level to verify one or more voltage levels of the second compacted voltage distribution.

9. The method of claim 8, wherein the interval is one of every two, three, or four of the multiple logical states.

10. The method of claim 8, wherein the initial voltage distribution represents all the logical states of the memory cells, and the first compacted voltage distribution represents one of two or three logical states subsequent to a first level (L0) of the multiple logical states.

11. The method of claim 10, wherein the second compacted voltage distribution represents one of two or three logical states subsequent to a lowest voltage level associated with the first compacted voltage distribution.

12. The method of claim 8, further comprising causing the memory cells to be programmed with at least one logical state, of the multiple logical states, between programming of the first compacted voltage distribution and the second compacted voltage distribution.

13. The method of claim 8, wherein
causing the first program verify operation to be performed comprises sending, across a wordline of the memory cells, at least one fewer program verify pulse compared to if the first compacted voltage distribution had not been compacted; and
causing the second program verify operation to be performed comprises sending, across the wordline of the memory cells, at least one fewer program verify pulse compared to if the second compacted voltage distribution had not been compacted.

14. A non-transitory computer readable medium comprising instructions, which when executed by a processing device, cause the processing device to perform operations comprising:
causing memory cells of a memory array to be programmed with an initial voltage distribution representing multiple logical states;
causing the memory cells to be programmed with a compacted subsequent voltage distribution representing a subset of logical states comprising an encoded compression of at least two of the multiple logical states, the compacted subsequent voltage distribution being programmed above a program verify voltage level at a higher voltage range than that of the initial voltage distribution, wherein the compacted subsequent voltage distribution is to span between the program verify voltage level and a next-higher program verify voltage level of the multiple logical states that is above the program verify voltage level; and
causing a first program verify operation of the compacted subsequent voltage distribution to be performed on the memory cells at the program verify voltage level to verify one or more voltage levels of the compacted subsequent voltage distribution.

15. The non-transitory computer readable medium of claim 14, wherein the initial voltage distribution represents all the logical states of the memory cells, and the compacted subsequent voltage distribution represents a remainder of the logical states except for a first level (L0) of the multiple logical states.

16. The non-transitory computer readable medium of claim 14, wherein the initial voltage distribution represents all the logical states of the memory cells, and the compacted subsequent voltage distribution represents the subset of the multiple logical states that are fewer than all remaining logical states.

17. The non-transitory computer readable medium of claim 14, wherein the operations further comprise:
causing the memory cells to be programmed with a second subsequent voltage distribution representing a second subset of logical states comprising at least two of the multiple logical states, the second subset of logical states having fewer logical states than the subset of logical states;
causing a second program verify operation to be performed on the second subsequent voltage distribution;
determining a width of the second subsequent voltage distribution; and
performing, based on the width being greater than a threshold value, compaction in causing the memory cells to be programmed with a next voltage distribution representing a further subset of logical states comprising an encoded compression of at least two of the multiple logical states that follows the second subsequent voltage distribution.

18. The non-transitory computer readable medium of claim 17, wherein the operations further comprise programming at least one logical state, of the multiple logical states, between the compacted subsequent voltage distribution and the second subsequent voltage distribution.

19. The non-transitory computer readable medium of claim 14, wherein the subset of logical states is a first percentage of all of the multiple logical states that have a highest voltage range compared to a remaining second percentage.

20. The non-transitory computer readable medium of claim 14, wherein causing the program verify operation to be performed comprises sending, across a wordline of the memory cells, at least one fewer program verify pulse compared to if the compacted subsequent voltage distribution representing the multiple logical states had not been compacted.

* * * * *